US012802752B2

(12) United States Patent
Amer et al.

(10) Patent No.: US 12,802,752 B2
(45) Date of Patent: Nov. 17, 2026

(54) RECONFIGURABLE ANALOG CURRENT-DOMAIN IN-MEMORY COMPUTE SRAM DESIGN FOR LOW-POWER APPLICATIONS

(71) Applicants: INTERNATIONAL BUSINESS MACHINES CORPORATION, Armonk, NY (US); MASSACHUSETTS INSTITUTE OF TECHNOLOGY, Cambridge, MA (US)

(72) Inventors: Aya Galal Mahdy Elsayed Amer, Cambridge, MA (US); Maitreyi Ashok, Cambridge, MA (US); Xin Zhang, Chappaqua, NY (US); Anantha Chandrakasan, Belmont, MA (US)

(73) Assignees: INTERNATIONAL BUSINESS MACHINES CORPORATION, Armonk, NY (US); MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 106 days.

(21) Appl. No.: 18/826,118

(22) Filed: Sep. 5, 2024

(65) Prior Publication Data

US 2026/0065981 A1 Mar. 5, 2026

(51) Int. Cl.
*G11C 11/419* (2006.01)
*G11C 5/14* (2006.01)

(52) U.S. Cl.
CPC ............ *G11C 11/419* (2013.01); *G11C 5/147* (2013.01)

(58) Field of Classification Search
CPC .............................. G11C 11/419; G11C 5/147
See application file for complete search history.

(56) References Cited

U.S. PATENT DOCUMENTS

| | | | | |
|---|---|---|---|---|
| 8,654,572 B2 * | 2/2014 | Houston | .................. | G11C 8/16 365/156 |
| 10,964,380 B1 * | 3/2021 | Wang | .................. | G11C 7/1006 |
| 2007/0195584 A1 * | 8/2007 | Imai | ...................... | G11C 11/412 365/154 |

(Continued)

OTHER PUBLICATIONS

A. Fritsch et al., "24.1 A 6.2 GHz Single Ended Current Sense Amplifier (CSA) Based Compileable 8T SRAM in 7nm FinFET Technology", 2021 IEEE International Solid-State Circuits Conference (ISSCC), Feb. 2021, 3 pages, DOI: 10.1109/ISSCC42613.2021.9365812.

(Continued)

*Primary Examiner* — Khamdan N. Alrobaie
(74) *Attorney, Agent, or Firm* — Amin, Turocy & Watson, LLP

(57) ABSTRACT

A static random-access memory (SRAM) device a read-port coupled to a voltage-to-time (VTC) conversion block. The read-port comprises a first transistor coupled to a pair of cross-coupled inverters. A pass gate transistor is coupled to the first transistor. A current-source transistor is coupled to the pass gate transistor. A row of the SRAM device is configured to generate a read wordline signal multiplied by one or more SRAM stored weights in response to receiving a voltage vector. The row is further configured to generate analog outputs for a multiply and compute operation (MAC).

21 Claims, 9 Drawing Sheets

(56) References Cited

U.S. PATENT DOCUMENTS

| | | | | |
|---|---|---|---|---|
| 2009/0168484 | A1* | 7/2009 | Liaw | H10B 10/00 365/72 |
| 2012/0230086 | A1* | 9/2012 | Chiu | G11C 11/412 365/154 |
| 2015/0131383 | A1 | 5/2015 | Akerib et al. | |
| 2016/0365140 | A1* | 12/2016 | Azuma | G11C 7/06 |
| 2019/0042160 | A1* | 2/2019 | Kumar | G06F 3/0659 |
| 2021/0263672 | A1* | 8/2021 | Chang | G11C 11/419 |
| 2022/0262426 | A1* | 8/2022 | Chiou | G11C 11/413 |
| 2024/0045655 | A1* | 2/2024 | Yang | G06F 7/5443 |

OTHER PUBLICATIONS

A. Singla et al., "An Energy-Efficient SRAM-Based Charge Domain Compute In-Memory Architecture," 2024 22nd IEEE Interregional NEWCAS Conference (NEWCAS), Sherbrooke, QC, Canada, Jun. 16, 2024, pp. 233-237, doi: 10.1109/NewCAS58973.2024.10666368.

Bo Liu et al., "An energy-efficient voice activity detector using deep neural networks and approximate computing", Microelectronics Journal, May 2019, pp. 12-21, vol. 87, doi: https://doi.org/10.1016/j.mejo.2019.03.009.

Chakraborty et al., "An Energy-Efficient Time Domain Based Compute In-Memory Architecture for Binary Neural Network", 2024 25th International Symposium on Quality Electronic Design (ISQED), Apr. 3, 2024, 6 pages, doi: 10.1109/ISQED60706.2024.10528729.

Chen Chao-Yu et al., "A Neuromorphic Spiking Neural Network Using Time-to-First-Spike Coding Scheme and Analog Computing in Low-Leakage 8T SRAM", IEEE Transactions on Very Large Scale Integration (VLSI) Systems, May 2024, pp. 848-859, vol. 32, No. 5, doi: 10.1109/TVLSI.2024.3368849.

F. Chen et al., "A 108-nW 0.8-mm2 Analog Voice Activity Detector Featuring a Time-Domain CNN With Sparsity-Aware Computation and Sparsified Quantization in 28-nm CMOS," in IEEE Journal of Solid-State Circuits, Nov. 2022, pp. 3288-3297, vol. 57, No. 11, doi: 10.1109/JSSC.2022.3191008.

H. Wang et al., "A 32.2 Tops/W SRAM compute-in-memory macro employing a linear 8-bit C-2C ladder for charge domain computation in 22nm for edge inference", In 2022 IEEE Symposium on VLSI Technology and Circuits (VLSI Technology and Circuits), Jun. 2022, pp. 36-37, doi: https://doi.org/10.1109/VLSITechnologyandCir46769.2022.9830322.

International Searching Authority, "Notification of Transmittal of the International Search Report and the Written Opinion of the International Searching Authority, or Declaration," Patent Cooperation Treaty, Nov. 18, 2025, 14 pages, International Application No.—PCT/EP2025/073648.

Jin-O-Seo et al., "Archon: a 332.7TOPS/W 5b Variation-Tolerant Analog CNN Processor Featuring Analog Neuronal Computation Unit and Analog Memory", 2022 IEEE International Solid-State Circuits Conference (ISSCC), Feb. 2022, 3 pages, DOI: 10.1109/ISSCC42614.2022.9731654.

M. Yang et al., "Design of an Always-On Deep Neural Network-Based 1- λ W Voice Activity Detector Aided With a Customized Software Model for Analog Feature Extraction," IEEE Journal of Solid-State Circuits, Jun. 2019, pp. 1764-1777, vol. 54, No. 6, doi: 10.1109/JSSC.2019.2894360.

Naveen Verma et al. "In-memory computing: Advances and prospects." IEEE Solid-State Circuits Magazine, Jul. 2019, pp. 43-55, doi: 10.1109/mssc.2019.2922889.

R. Khaddam-Aljameh et al., "HERMES Core—A 14nm CMOS and PCM-based In-Memory Compute Core using an array of 300ps/LSB Linearized CCO-based ADCs and local digital processing", 2021 Symposium on VLSI Circuits, Jun. 2021, 2 pages, DOI: 10.23919/VLSICircuits52068.2021.9492362.

S. Mittal et al., "A survey of SRAM-based in-memory computing techniques and applications", Journal of Systems Architecture, Oct. 2021, 36 pages, vol. 119, doi: https://doi.org/10.1016/j.sysarc.2021.102276.

Xin Si et al., "24.5 A Twin-8T SRAM Computation-In-Memory Macro for Multiple-Bit CNN-Based Machine Learning", Conference: 2019 IEEE International Solid-State Circuits Conference—(ISSCC), Feb. 2019, 3 pages, DOI: 10.1109/ISSCC.2019.8662392.

Yu, Chengshuo et al., "A 65-nm 8T SRAM compute-in-memory macro with column ADCs for processing neural networks", IEEE Journal of Solid-State Circuits, 2022, pp. 3466-3476, vol. 57, No. 11, doi: https://dx.doi.org/10.1109/JSSC.2022.3162602.

Z. Chen et al., "CAP-RAM: A charge-domain in-memory computing 6T-SRAM for accurate and precision-programmable CNN inference", IEEE Journal of Solid-State Circuits, Jul. 6, 2021, 12 pages, vol. 56, No. 6, doi: https://arxiv.org/abs/2107.02388.

Zhang et al., "In-Memory Computation of a Machine-Learning Classifier in a Standard 6T SRAM Array", IEEE Journal of Solid-State Circuits, Mar. 2017, 10 pages, doi: 10.1109/JSSC.2016.2642198.

* cited by examiner

RECONFIGURABLE ANALOG CURRENT-DOMAIN IN-MEMORY COMPUTE SRAM DESIGN FOR LOW-POWER APPLICATIONS

BACKGROUND

Technical Field

The present disclosure generally relates to computing hardware, and more particularly to a reconfigurable analog current-domain in-memory compute SRAM design for low-power applications.

Description of the Related Art

In-Memory Computing (IMC) has been identified as a viable alternative to the conventional von-Neumann computing paradigm. By performing computation in-place (in-memory) the time and energy cost associated with shuffling data between a processing element and a memory is alleviated, leading to more efficient systems.

In-memory compute SRAM accelerator architectures have recently gained lots of interest since they overcome the energy overhead in conventional Von-Neumann architectures resulting from the excessive data movement between memory and processing units to implement MAC operations. IMC accelerators can access multiple rows in the SRAM memory array in parallel while performing computing inside the memory at the same time. Thus, IMC accelerators significantly reduce data movement and read energy resulting in higher system throughput and lower overall power consumption. State-of-the-art current-domain IMC SRAMs can achieve superior energy-efficient MAC computing compared to digital implementations by leveraging parallelism, fewer memory accesses. Analog MAC computing is performed by accumulating the SRAM cells' bitline discharging currents resulting from multiplying inputs by stored weights.

SUMMARY

According to an embodiment of the present disclosure, a static random-access memory (SRAM) device is provided. The SRAM device includes a twelve transistor (12T) SRAM cell. A read-port is coupled to a voltage-to-time (VTC) conversion block. The read-port comprises a first transistor coupled to a pair of cross-coupled inverters. A pass gate transistor is coupled to the first transistor. A current-source transistor is coupled to the pass gate transistor. A row of the SRAM device is configured to generate a read wordline signal multiplied by one or more SRAM stored weights in response to receiving a voltage vector. The row is further configured to generate analog outputs for a multiply and compute operation (MAC). The SRAM device further includes a current sense amplifier coupled to a read bit line on an output of the read-port.

According to an embodiment of the present disclosure, a static random-access memory (SRAM) cell is provided. A read-port is coupled to a voltage-to-time (VTC) conversion block. The read-port comprises a first transistor coupled to a pair of cross-coupled inverters. A pass gate transistor is coupled to the first transistor. A current-source transistor is coupled to the pass gate transistor. A row of the SRAM cell is configured to generate a read wordline signal multiplied by one or more SRAM stored weights in response to receiving a voltage vector. The row is further configured to generate analog outputs for a multiply and compute operation (MAC).

According to an embodiment of the present disclosure, an in-memory compute (IMC) static random-access memory (SRAM) architecture is provided. The architecture includes a plurality of voltage-to-time (VTC) conversion blocks and an SRAM array. The SRAM array includes a plurality of rows coupled to the plurality of VTC blocks. The rows include a read-port. The read-port includes a first transistor coupled to a pair of cross-coupled inverters. A pass gate transistor in the read-port is coupled to the first transistor. A current-source transistor in the read-port is coupled to the pass gate transistor. A row of the SRAM architecture is configured to generate a read wordline signal multiplied by one or more SRAM stored weights in response to receiving a voltage vector. The row is further configured to generate analog outputs for a multiply and compute operation (MAC).

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Definitions

In-Memory Computing (IMC), as used herein, refers to a computing paradigm in which memory devices are used to encode data and to perform part or the whole computation associated with a workload.

Multiply and Accumulate (MAC), as used herein, refers to a computing step that computes the product of two numbers and adds that product to an accumulator.

Wordline, as used herein, refers to a row of memory cells in an array of rows of memory cells in random access memory. A wordline is used with the bitline to generate the address of each cell.

Bitline, as used herein, refers to a column in an array of columns of memory cells in random access memory. A bitline is used with the wordline to generate the address of each cell.

SRAM, as used herein, refers to a static random-access memory (RAM) that uses latching circuitry (flip-flop) to store each bit. SRAM is volatile memory; data is lost when power is removed.

Current-starved, as used herein, refers to limiting the current provided to an element (for example, an inverter).

Overview

The present disclosure generally provides a low-power reconfigurable 12T-SRAM current-domain analog in-memory computing (IMC) SRAM macro design to address non-linearities, process variations, and limited throughput. The subject design features a time-domain sub-threshold multiply and accumulate (MAC) operation with a differential output current sensing technique. A reconfigurable current-controlled design supports different precisions and speeds. A 1 kbit macro in a 14-nm CMOS process achieves a measured bitwise energy efficiency of 580 TOPS/W while obtaining highly linear MAC operations. This is the highest energy efficiency reported for IMC current-domain computing methods. In addition, simulation results and estimations based on blocks and 1 kb macro measurements show that increasing the macro size to 16 kbit can achieve 2128 TOPS/W, which is comparable to other charge domain computing methods.

Figure 1:
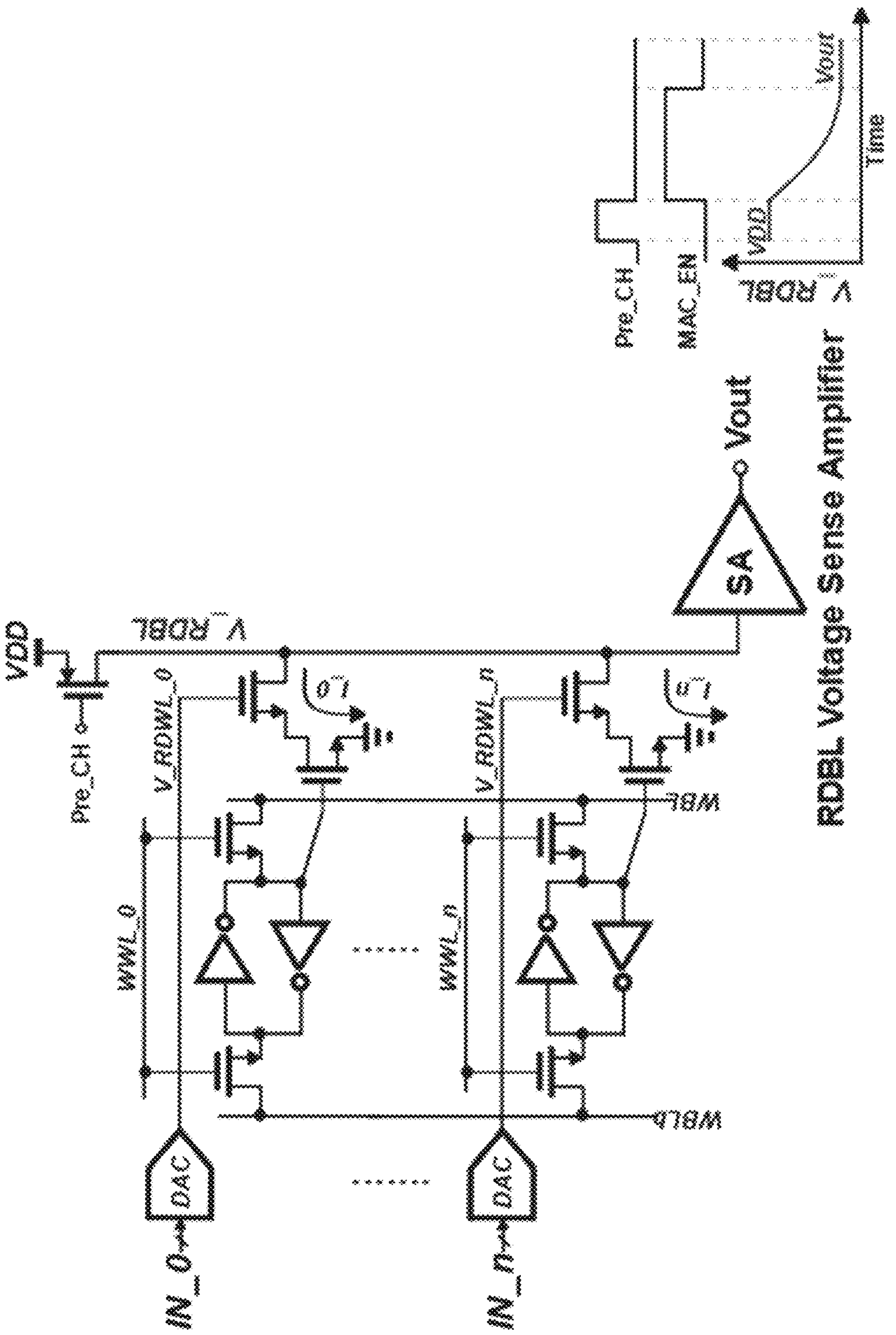
FIG. 1 (PRIOR ART)
FIG. 1 is a circuit diagram of a conventional current-domain in-memory compute 8T-SRAM with a plot of simulated non-linear performance output.

FIG. 1 shows the conventional 8T-SRAM current-domain IMC, where the analog inputs are applied to read wordlines (RDWLs) which control SRAM read currents. The read bitline (RDBL) is first pre-charged to $V_{DD}$, then discharged by SRAM MAC output current to generate $V_{RDBL}$ which is sensed by a voltage sense amplifier. This architecture is compatible with standard 8T SRAM cells and can support analog/n-bit inputs and n-bit weights while achieving high energy efficiency.

However, the performance is restricted by low computing accuracy from many factors. First, there is limited signal margin at low $V_{DD}$ which limits the number of activated wordlines per column resulting in limited throughput and parallelism. This is because of the high and uncontrolled discharging SRAM cell current value. MAC output non-linearity with output codes also contributes to low computing accuracy, as does read bitline (RDBL) discharge using the conventional RDBL voltage sensing technique. This happens at higher output codes (lower $V_{RDBL}$ values) when the SRAM discharging transistors enter the linear region introducing non-linearity which limits the MAC accuracy and MAC parallelism. MAC output non-linearity with input codes, which limits the MAC speed also contributes to low computing accuracy. This happens because of the slewing behavior of $V_{RDWL}$ of the DAC output when driving large RDWL capacitance. Process variations of SRAM read port discharge current which limits MAC accuracy can also contribute to low computing accuracy.

According to an embodiment of the present disclosure, a static random-access memory (SRAM) device is provided. The SRAM device includes a twelve transistor (12T) SRAM cell. A read-port is coupled to a voltage-to-time (VTC) conversion block. The read-port comprises a first transistor coupled to a pair of cross-coupled inverters. A pass gate transistor is coupled to the first transistor. A current-source transistor is coupled to the pass gate transistor. A current-source transistor is coupled to the pass gate transistor. A row of the SRAM device is configured to generate a read wordline signal multiplied by one or more SRAM stored weights in response to receiving a voltage vector. The row is further configured to generate analog outputs for a multiply and compute operation (MAC). The SRAM device further includes a current sense amplifier coupled to a read bit line on an output of the read-port. As will soon be appreciated in view of the disclosure below, the addition of the current-source transistor to the read-port provides a current-controlled structure that overcomes the limited signal margin challenge at low voltage operation and read current process variations. In addition, a low power operation is achieved. The subthreshold analog MAC operation becomes linear, energy-efficient, and reconfigurable (by adjusting biasing currents to control MAC speed, throughput, and bit precision based on application). As such, the need for ADCs/DACs between cascaded neural network layers is eliminated, saving area and energy overhead of data conversion.

According to one embodiment, which can be combined with one or more previous embodiments, the current sense amplifier is configured to provide negative feedback to the read-port and adjust a voltage on the read bit line. This feature improves MAC linearity and lowers variations. The current sensing using the current sense amplifier overcomes non-linearities with output codes and RDBL discharge challenges.

According to one embodiment, which can be combined with one or more previous embodiments, a current control circuit is coupled to the current-source transistor. A low-power current-controlled SRAM read operation may be used to adjust the MAC speed and throughput based on the application. This feature overcomes the limited signal margin challenge at low voltage operation and read current process variations, in addition to achieving a low power subthreshold operation.

According to one embodiment, which can be combined with one or more previous embodiments, the SRAM device further includes a current control circuit coupled to the current-source transistor. In addition, a current sense amplifier is coupled to the read bit line. The current control circuit is configured to limit an output current coming out of the current-source transistor and onto the read bit line. The current sense amplifier is configured to sense the output current on the read bit line, provide negative feedback to the read-port, and adjust a voltage on the read bit line. This combination of features improves MAC linearity and lowers variations. The current sensing using the current sense amplifier overcomes non-linearities with output codes and RDBL discharge challenges.

According to one embodiment, which can be combined with one or more previous embodiments, the VTC is embedded with a rectified linear unit activation function. This feature provides compatibility of the SRAM device with neural network applications.

According to one embodiment, which can be combined with one or more previous embodiments, the read-port is configured to activate for a certain time linearly proportional to an input voltage (Vin) based on the generated wordline signal. By activating the read-port for a certain time linearly proportional to the input voltage, the SRAM $I_{RDBL}$ output current pulse can be integrated with time helping to contribute to non-linearity of the output products of the MAC operations.

According to one embodiment, which can be combined with one or more previous embodiments, the current-source transistor is biased in a subthreshold saturation region. The $V_{RDBL}$ becomes fixed using a current sense amplifier (CSA) with negative feedback, so the $I_{RDBL}$ absolute value does not change with different input and output values. In addition, $I_{RDBL}$ μ is reduced by 2000× by adjusting $I_{ref}$ to operate the SRAM current source in the subthreshold region, which also overcomes read current process variations and non-linearities.

According to one embodiment, which can be combined with one or more previous embodiments, the SRAM device further includes a read-port replica and a current mirror coupled to the read-port, configured to control a read current on the read bit line. By controlling the read-current $I_{RDBL}$ with a read-port replica and current mirror, σ/μ is reduced to 0.4% under process variations, compared to σ/μ of 15% of a conventional 8T cell.

According to one embodiment, which can be combined with one or more previous embodiments, the VTC device further includes a pair of cascaded current-starved inverters coupled to control the SRAM read-port. This feature allows the VTC device to operate as a low power device using a low power VTC comparator in addition to extending input voltage range.

According to one embodiment, which can be combined with one or more previous embodiments, the SRAM cell includes a twelve transistor (12T) configuration. The 12T configuration provides a current-source transistor in the read-port that provides different methods of reducing non-linearity in sensing the read bitline output current, thus improving accuracy of the MAC output.

According to an embodiment of the present disclosure, a static random-access memory (SRAM) cell is provided. A read-port, coupled to a VTC block, comprises a first transistor coupled to a pair of cross-coupled inverters. A pass gate transistor is coupled to the first transistor. A current-source transistor is coupled to the pass gate transistor. A voltage vector applied to a row of the SRAM device through the VTC generates a read wordline signal multiplied by one or more SRAM stored weights, generating analog outputs for a multiply and compute operation (MAC). As will soon be appreciated by the disclosure below, the addition of the current-source transistor to the read-port provides a current-controlled structure that overcomes the limited signal margin challenge at low voltage operation and read current process variations. In addition, a low power operation is achieved. The subthreshold analog MAC operation becomes linear, energy-efficient, and reconfigurable (by adjusting biasing currents to control MAC speed, throughput, and bit precision based on application). As such, the need for ADCs/DACs between cascaded neural network layers is eliminated, saving area and energy overhead of data conversion.

According to one embodiment, which can be combined with one or more previous embodiments, the read-port is configured to activate for a certain time linearly proportional to an input voltage (Vin) based on the generated wordline signal. By activating the read-port for a certain time linearly proportional to the input voltage, the SRAM $I_{RDBL}$ output current pulse can be integrated with time helping to contribute to improved non-linearity of the output products of the MAC operations.

According to one embodiment, which can be combined with one or more previous embodiments, the current-source transistor is biased in a subthreshold saturation region. The $V_{RDBL}$ becomes fixed using a current sense amplifier (CSA) with negative feedback, so the $I_{RDBL}$ absolute value does not change with different input and output values. In addition, $I_{RDBL}$ μ is reduced by 2000× by adjusting $I_{ref}$ to operate the SRAM current source in the subthreshold region, which also overcomes read current process variations and non-linearities.

According to one embodiment, which can be combined with one or more previous embodiments, the SRAM cells in one row are further connected to a read-port replica and a current mirror coupled to the read-port, configured to control a read current on the read bit line. By controlling the read-current $I_{RDBL}$ with a read-port replica and current mirror, σ/μ is reduced to 0.4% under process variations, compared to σ/μ of 15% of a conventional 8T cell.

According to one embodiment, which can be combined with one or more previous embodiments, the VTC further includes a pair of cascaded current-starved inverters coupled to control the SRAM read-port. This feature allows the VTC device to operate as a low power device using a low power VTC comparator in addition to extending input voltage range.

According to one embodiment, which can be combined with one or more previous embodiments, the read-port includes a twelve transistor (12T) configuration. The 12T configuration provides a current-source transistor in the read-port that provides different methods of reducing non-linearity in sensing the read bitline output current, thus improving accuracy of the MAC output.

According to an embodiment of the present disclosure, an in-memory compute (IMC) static random-access memory (SRAM) architecture is provided. The architecture includes a plurality of voltage-to-time (VTC) conversion blocks and an SRAM array. The SRAM array includes a plurality of rows coupled to the plurality of VTC blocks. The rows include a read-port. The read-port includes a first transistor coupled to a pair of cross-coupled inverters. A pass gate transistor in the read-port is coupled to the first transistor. A current-source transistor in the read-port is coupled to the pass gate transistor. A voltage vector applied to the plurality of rows of the SRAM device through the plurality of VTC blocks generates a read wordline signal multiplied by one or more SRAM stored weights, generating analog outputs for a multiply and compute operation (MAC). As will soon be appreciated by the disclosure below, the addition of the current-source transistor to the read-port provides a current-controlled structure that overcomes the limited signal margin challenge at low voltage operation and read current process variations. In addition, a low power operation is achieved. The subthreshold analog MAC operation becomes linear, energy-efficient, and reconfigurable (by adjusting biasing currents to control MAC speed, throughput, and bit precision based on application). As such, the need for ADCs/DACs between cascaded neural network layers is eliminated, saving area and energy overhead of data conversion.

According to one embodiment, which can be combined with one or more previous embodiments, the SRAM array includes a plurality of columns storing ternary weight values. This feature enhances the efficiency and performance of the SRAM in neural network applications by allowing for more nuanced computations, improving the accuracy of the application.

According to one embodiment, which can be combined with one or more previous embodiments, the architecture further comprises a plurality of read bitlines in the SRAM array. A differential output current sense amplifier is connected to the plurality of read bitlines. An integrating capacitor is coupled to the differential output current sense amplifier, and configured to generate an analog MAC output. This combination of features improves the accuracy of the MAC output.

According to one embodiment, which can be combined with one or more previous embodiments, the architecture further comprises a current control circuit coupled to the current-source transistor of each of the plurality of rows in the SRAM array. The current control circuit is configured to limit an output current coming out of the current-source transistor. This combination of features improves MAC linearity and lowers variations. The current sensing using the current sense amplifier overcomes non-linearities with output codes and RDBL discharge challenges.

According to one embodiment, which can be combined with one or more previous embodiments, the architecture further comprises a read-port replica and a current mirror in the current control circuit, coupled to the read-port of each of the plurality of rows in the SRAM array. The transfer characteristics from this feature shows that the current sense amplifier output current increases linearly with the input current of the read bitline while keeping read bitline voltage regulated at a constant voltage, which improves the SRAM read port linearity.

According to one embodiment, which can be combined with one or more previous embodiments, the SRAM cell includes a twelve transistor (12T) configuration. The 12T configuration provides a current-source transistor in the read-port that provides different methods of reducing nonlinearity in sensing the read bitline output current, thus improving accuracy of the MAC output.

Details of the above-identified embodiments and features are provided in the examples of embodiments below.

Example Analog IMC SRAM Design

Figure 2:
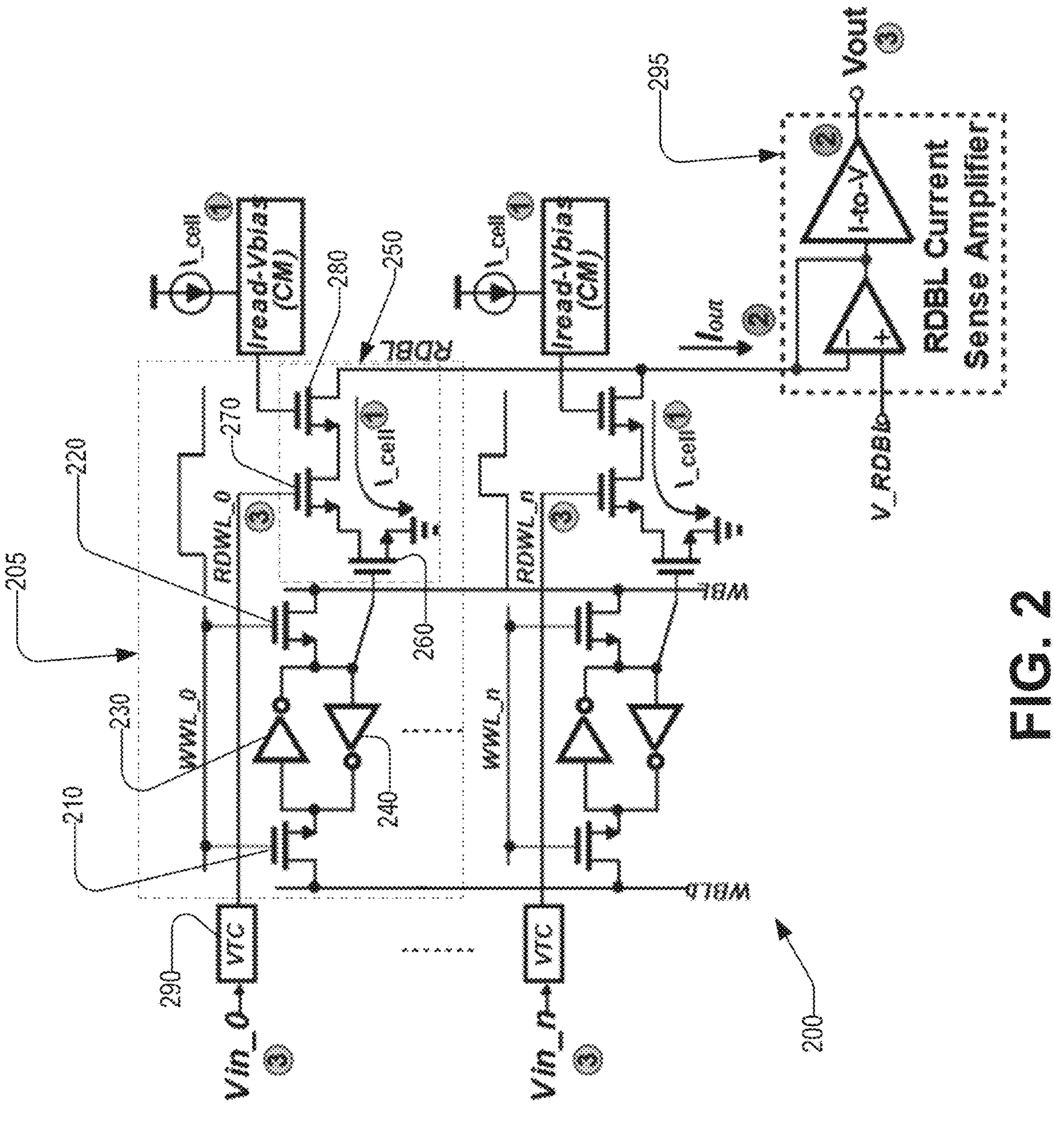
FIG. 2 is a circuit diagram of a current-domain in-memory compute SRAM, in accordance with an illustrative embodiment.

According to an embodiment of the present disclosure, an analog IMC SRAM 200 is disclosed as shown in FIG. 2. The subject IMC SRAM 200 may include a plurality of twelve transistor (12T) SRAM cells 205. The read-port 250 includes an additional current-source transistor (MR) 280 connected in series to the 2T read port in 8T-SRAM cells (M1, M2). The SRAM cell 205 includes two pass gate transistors 210 and 220, a pair of cross-coupled inverters 230 and 240, and a read port 250. The pass gate transistors 210 and 220 may pull down one of the inverter's (230 or 240) inputs to 0 based on WBL and WBLB values. The inverters 230 and 240 are cross coupled between the nodes coupling the pass gate transistors to the inverters 230 and 240, and form a latch. The pass gate transistor 210 is coupled between a complementary write bit line WBLb and the first node, and the pass gate transistor 220 is coupled between a write bit line WBL and the second node, wherein the write bit line WBL is complementary to the complementary write bit line WBLb. The gates of the pass gate transistors 210 and 220 are coupled to the same write word line WWL ($WWL_0$ . . . $WWL_n$). The pass gate transistors 210 and 220 may be NMOS transistors. The read port 250 includes the transistor 260 and a pass gate transistor 270. The transistor 260 may be an NMOS transistor, and is coupled between a ground GND and the pass gate transistor 270. The gate of the transistor 260 is coupled to a point between the pass gate transistors 210 and 220. The pass gate transistor 270 is coupled between a VTC 290 at $V_{in}$ and the source of the current-source transistor 280. The gate of the pass gate transistor 270 is coupled to the read word line RWL.

The additional current-source transistor 280 is used to control SRAM bit cell read current $I_{RDBL}$ by mirroring $I_{ref}$ to $I_{RDBL}$ using a read-port replica $250_R$ with current mirror. Then, the SRAM stored W and digital RDWL signal turn on/off the read-port switches in current-source transistors 260 and 270 respectively. A low-power current-controlled SRAM read operation, (designated by the elements called out by the encircled number 1) may be used to adjust the MAC speed and throughput based on the application. As will be appreciated, adding the current-source transistor MR to the read port current-source transistors 260 and 270 overcomes the limited signal margin challenge at low voltage operation and read current process variations, in addition to achieving a low power subthreshold operation.

The IMC SRAM 200 may include a differential RDBL output current sensing configuration (for example, using a current sense amplifier), (designated by the elements called out by the encircled number 2) with negative feedback (which may be used to adjust VRDBL voltage to a $V_{RDBL}$ value applied to the positive terminal of the Opamp shown in FIG. 2), to improve MAC linearity, and lower variations. The current sensing structure overcomes non-linearities with output codes and RDBL discharge challenges. The IMC SRAM may include a time-domain subthreshold linear MAC operation, (designated by the elements called out by the encircled number 3) supporting analog inputs and outputs and achieving higher throughput while improving MAC linearity. This technique overcomes the slewing of RDWL and non-linearity with input codes while achieving high energy efficiency. In addition, the proposed design eliminates the need for ADCs/DACs between cascaded neural network layers, saving area and energy overhead of data conversion.

The analog time-domain IMC MAC is done by pulse-width modulating the RDWL signal with analog input ($V_{in}$) using a rectified linear unit (ReLU) activation function embedded voltage-to-time conversion block (VTC) (discussed in detail below in reference to FIG. 4A), where the generated RDWL signal activates the SRAM read port for a certain time ($T_{out}$) linearly proportional to $V_{in}$, hence SRAM $I_{RDBL}$ output current pulse integration with time represents the dot product of $V_{in}$ and W. The subject cell configuration overcomes read current process variations and non-linearities with input and output codes through the following.

The current-source transistor 280 may be biased in the subthreshold saturation region. $V_{GS}$, and $V_{DS}$ are fixed at ~$VG_{RDWL}$, and $V_{RDBL}$ respectively. This $V_{RDBL}$ may be fixed using a current sense amplifier (CSA) with negative feedback, so the $I_{RDBL}$ absolute value does not change with different input and output values.

Figure 3:
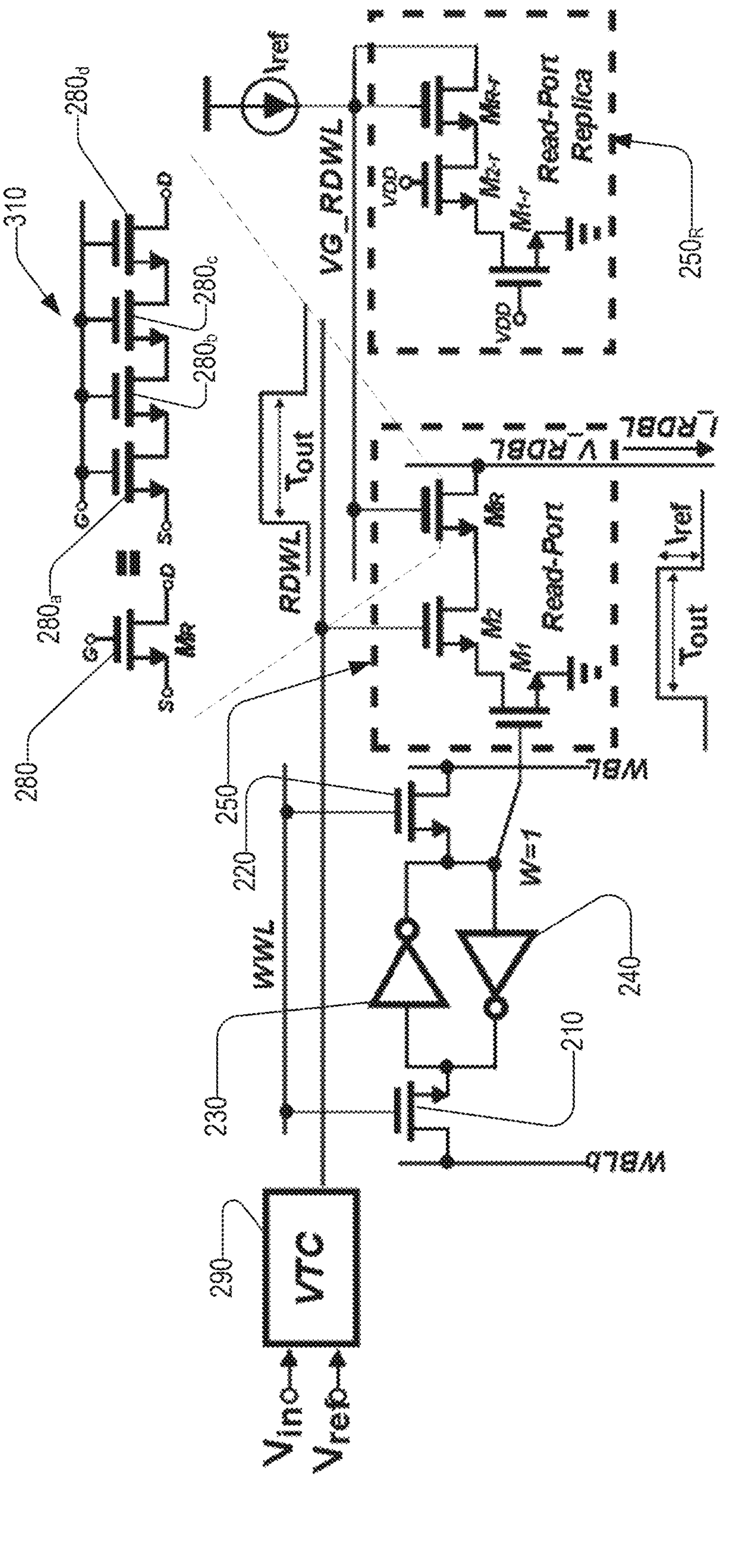
FIG. 3 is a circuit diagram of a 12T-SRAM cell structure with time-domain multiplication, consistent with an illustrative embodiment.

As shown by the inset 310 of FIG. 3, the current-source transistor 280 may be implemented with a larger area (length and width) to overcome variations due to channel length modulation effect as well as the random mismatches. However, to minimize the area overhead of the current-source transistor 280 to the overall cell area, the current-source transistor 280 may be implemented with four stacked min-length and width transistors (280$_a$-280$_d$), resulting in an effective longer length and larger area with a compact cell layout (compared to a longer length FET) that is compatible with standard 8T SRAM transistors. A Monte-Carlo simulation shows that the SRAM cell read current $I_{RDBL}$ σ/μ is reduced to 0.4% under process variations, compared to σ/μ of 15% of the conventional 8T cell. In addition, $I_{RDBL}$ μ is reduced by 2000× by adjusting $I_{ref}$ to operate the SRAM current source in the subthreshold region.

Figure 4A:
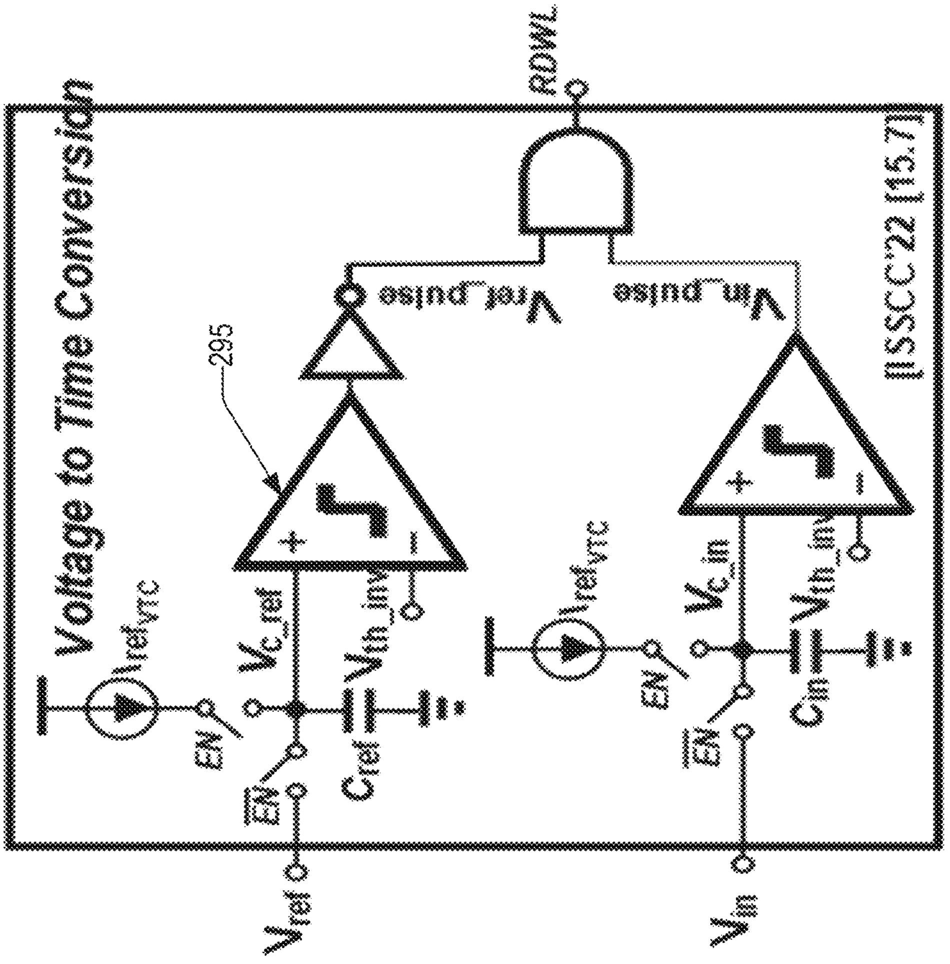
FIG. 4A is a circuit diagram of a voltage-to-time conversion block (VTC), consistent with an illustrative embodiment.
Figure 4B:
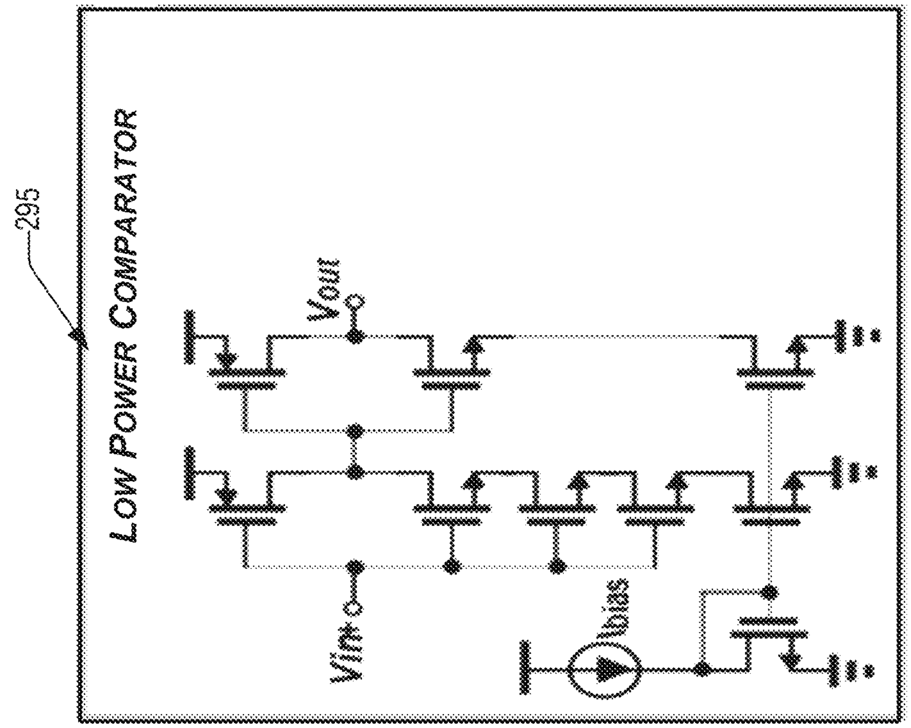
FIG. 4B is a circuit diagram of a low-power comparator in the VTC block of FIG. 4A, consistent with an illustrative embodiment.
Figure 4C:
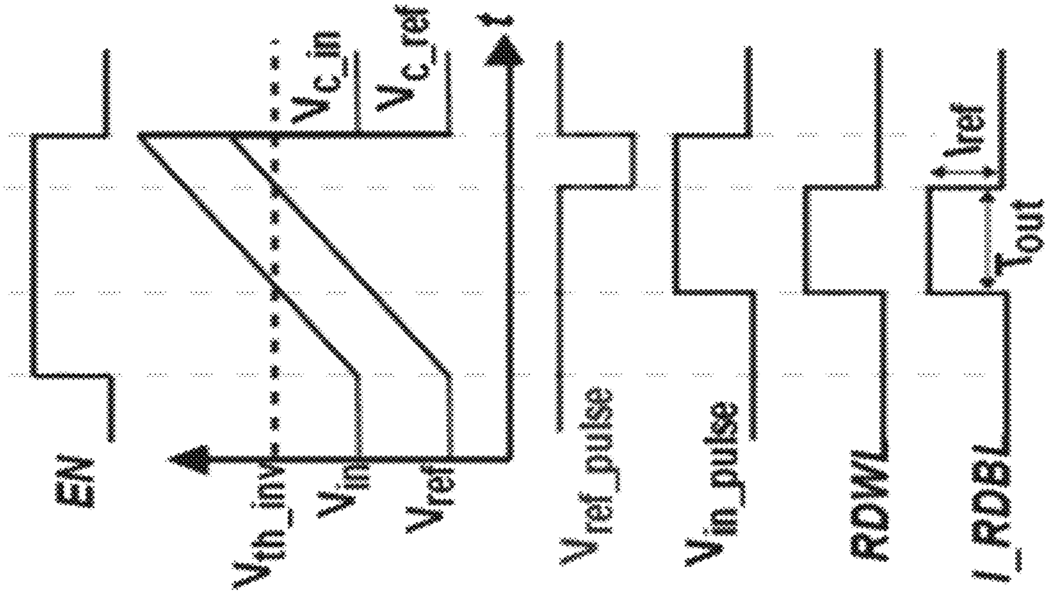
FIG. 4C is a set of timing waveforms associated with the VTC block of FIG. 4A, consistent with an illustrative embodiment.

Referring now to FIG. 4A, 4B, 4C, the schematics of the ReLU embedded VTC block is shown according to an embodiment. The VTC block includes two identical pulse generators for both $V_{in}$, $V_{ref}$ to generate $V_{(in\_pulse)}$, $V_{(ref\_pulse)}$, which are then subtracted to generate a RDWL pulse. As can be seen, the VTC output is a pulse-width modulated RDWL signal as a function of $V_{in}$, and hence the SRAM cell output read current $I_{RDBL}$ is a function of $V_{in}$. Initially when the EN signal is low, $V_{in}$ and $V_{ref}$ values are sampled on $C_{in}$ and $C_{ref}$ capacitors respectively. When the EN signal is activated, those capacitors are charged by a reference current source ($I_{(ref\_VTC)}$) generating two ramp signals $V_{(c\_in)}$ and $V_{c\_ref}$. A comparator is used to compare those voltages to a reference voltage ($V(_{th\_inv})$) to generate the output pulses, which are then subtracted by an AND gate to generate the RDWL pulse. Thus, when $V_{in}$ increases, the output RDWL pulse width increases.

The proposed low-power VTC comparator with current-controlled threshold may be implemented by two cascaded current-starved inverters 295 for low-power operation (the comparator is the main source of VTC power). The comparator input ($V_{in}$+) is compared to the first inverter threshold voltage ($V_{th_{inv}}$), which can be adjusted with $I_{bias}$. So, when $I_{bias}$ increases, the inverter pull-down transistors become stronger and decrease the value of $V_{th_{inv}}$ at the cost of higher power consumption. However, to achieve higher input dynamic range, $V_{th_{inv}}$ should be adjusted near $V_{DD}$, resulting in much less power consumption. To do that, three stacked NMOS transistors may be used in the first inverter of current sense amplifier 295 to achieve near $V_{DD}$ $V_{th_{inv}}$ value for a higher input dynamic range. It should be appreciated that this VTC implementation is robust against variations since a reference pulse (generated from Vref) is subtracted from the input pulse (generated from $V_{in}$). This subtraction overcomes $T_{out}$ process variations with the VTC integrating current ($I_{ref_{VTC}}$) and capacitors ($C_{in}$, $C_{ref}$).

Figure 5A:
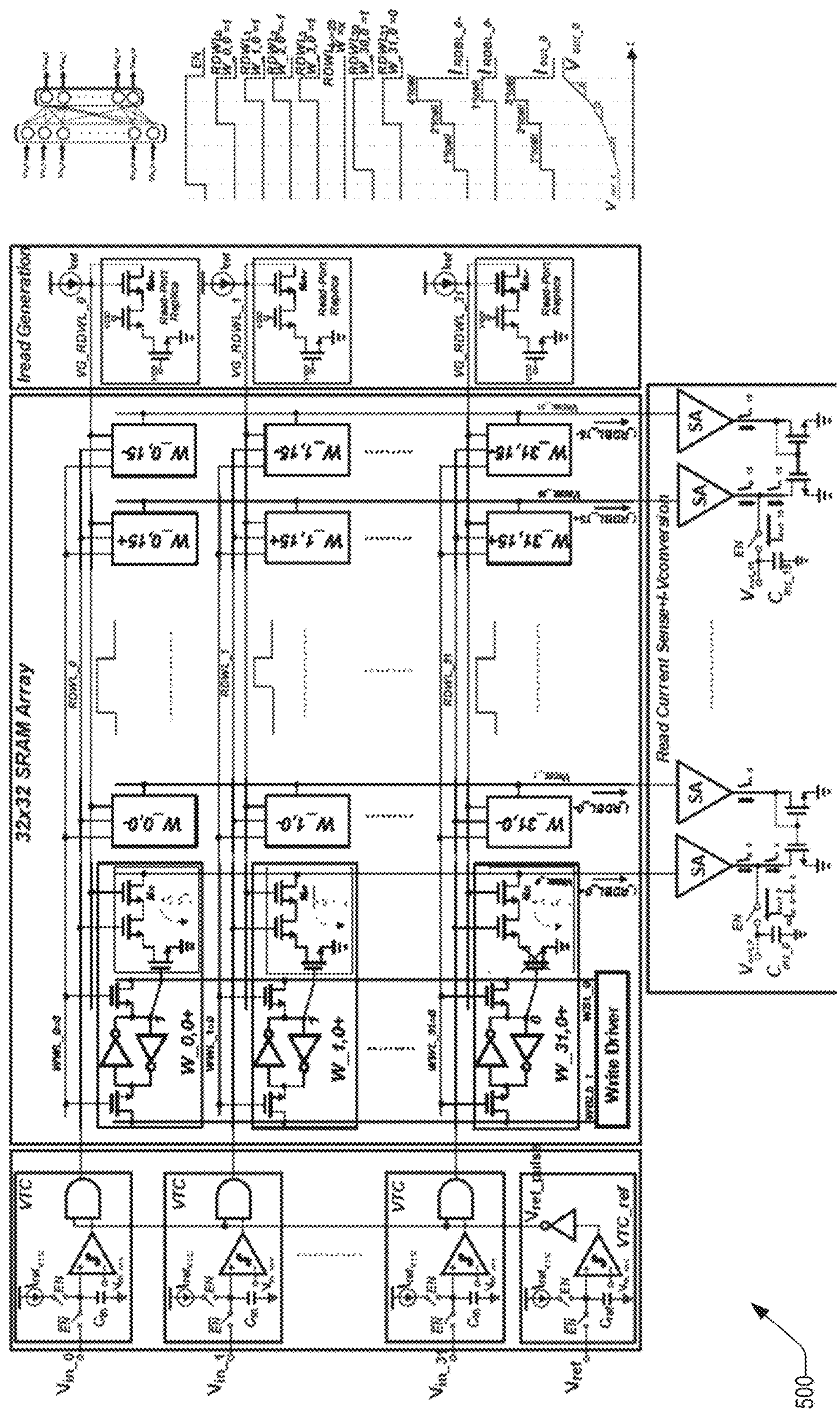
FIG. 5A is a circuit diagram of a 1 kbit SRAM macro architecture, consistent with an illustrative embodiment.
Figure 5B:
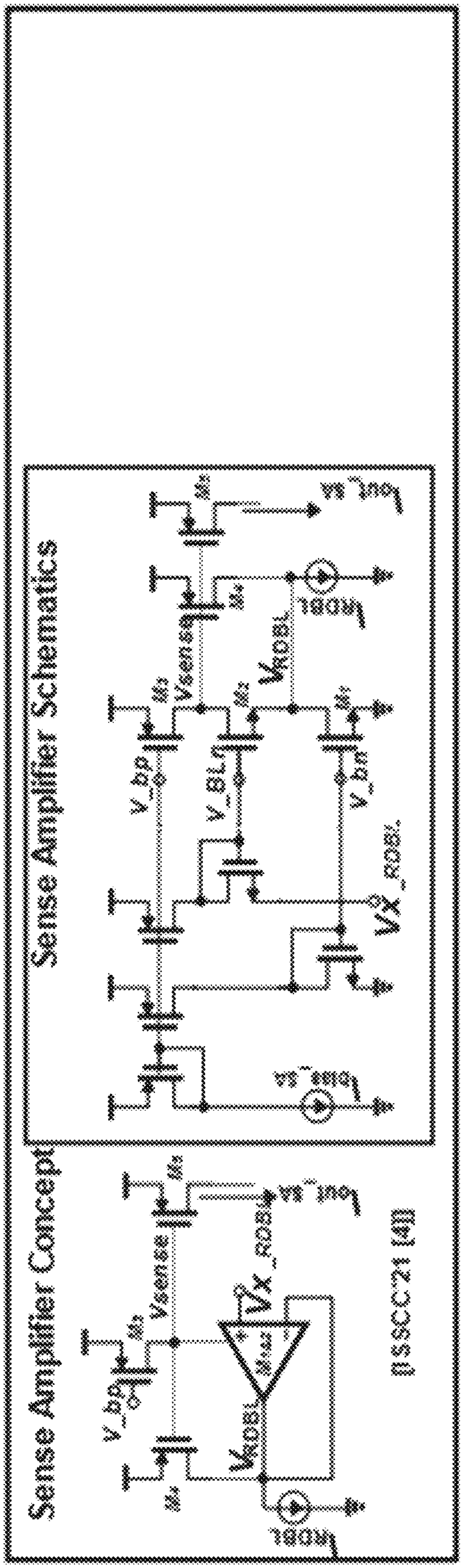
FIG. 5B is a circuit diagram of a sense amplifier module for use in the architecture of FIG. 5A, consistent with an illustrative embodiment.

FIG. 5A shows a current sense amplifier (CSA) included for each of the SRAM columns to sense the output MAC current and convert the output MAC current to an output voltage. The concept and schematics of SRAM RDBL CSA are shown in FIG. 5B, where a shunt-shunt negative feedback loop regulates/sets the RDBL voltage at a chosen $V_{x\_RDBL}$ value, senses the output MAC current ($I_{RDBL}$), and generates $V_{sense}$ ($M_{4,5}$ gate biasing voltage) to mirror $I_{RDBL}$ to the CSA output current $I_{out\_SA}$. The negative feedback loop has a common gate stage ($M_2$, $M_3$), followed by a common source stage ($M_4$, $M_1$) to regulate $V_{RDBL}$ and provide the required current through $M_4$, which is mirrored to $M_5$ representing the output sensed current. To adjust the DC biasing voltages of (M1-M3), a DC bias generator circuit may be used to set the transistors' operating points such that M1 sinks the small DC bias current of the common gate stage, and also adjusts M2, M3 gate voltages to operate properly. The DC bias generator circuit also provides robust bias voltages across PVT variations.

Example IMC SRAM Macro Architecture

Referring now to FIG. 5, an analog IMC SRAM 1 kb macro architecture 500 is shown. The $V_{in}$ vector is applied to SRAM rows (through VTCs to generate RDWL signals) to be multiplied by SRAM stored weights (shown as (W0,0) to (W31,15) written inside each SRAM cell) to generate analog outputs. Every two adjacent SRAM columns store 2b ternary weight {−1, 0, 1} for one output, and the 2 columns of RDBLs are connected to a differential output CSA generating $I_{out}=I_{RDBL+}-I_{RDBL-}$, followed by an integrating capacitor ($C_{int}$) to generate one analog MAC output ($V_{out}$).

For differential sensing implementation, 2 CSAs followed by a current mirror stage are used to subtract the 2 output sense currents ($I_p$, $I_n$) resulting from 2 adjacent SRAM columns. The resulting CSA differential current ($I_{out}=I_p-I_n$) can then be converted to an analog MAC voltage by either charging or discharging $C_{int}$ ($C_{int}$ is precharged to a reference voltage) representing positive or negative MAC output values. Thus, MAC output voltage ($V_{out_n}$) can be expressed as follows:

$$V_{out_n} = \frac{1}{C_{int_n}} \sum\nolimits_{i=0}^{m} I_{RDBL_{cell}} * T_{pulse_i} * (W_{i,n+} - W_{i,n-})$$

$$V_{out_n} = \frac{I_{RDBL_{cell}}}{C_{int_n}} \sum\nolimits_{i=0}^{m} T_{pulse_i} * (W_{i,n+} - W_{i,n-})$$

Where $T_{pulse_i}$ is the VTC output ($RDWL_i$) pulse width of the $i_{th}$ row generated from $V_{in_i}$ and can be expressed as:

$$T_{pulse_i} = \frac{C_{int_{VTC}}}{I_{ref_{VTC}}} * \left(V_{in_i} - V_{ref}\right)$$

Thus, $V_{out_n}$ can be written as:

$$V_{out_n} = \frac{I_{RDBL_{cell}}}{C_{int_n}} * \frac{C_{int_{VTC}}}{I_{ref_{VTC}}} \sum\nolimits_{i=0}^{m} \left(V_{in_i} - V_{ref}\right) * (W_{i,n+} - W_{i,n-})$$

Hence, $V_{out_n}$ is a weighted sum of multiplying m (32) inputs by corresponding weights. It is also shown that the MAC output is scaled by the ratio of SRAM read cell current and VTC integrating current ($I_{RDBL_{cell}}/I_{ref_{VTC}}$) of each cell, and the ratio of VTC and MAC integrating capacitors ($C_{in_{VTC}}/C_{int}$). It should be noted that the differential CSA implementation cancels mismatches and output leakage current at zero $I_{RDBL}$. In addition, implementing the subtraction in the current domain (before conversion to voltage) extends the output signal margin at lower $V_{DD}$ operation and improves the MAC linearity.

Example Methodology

Figure 6:
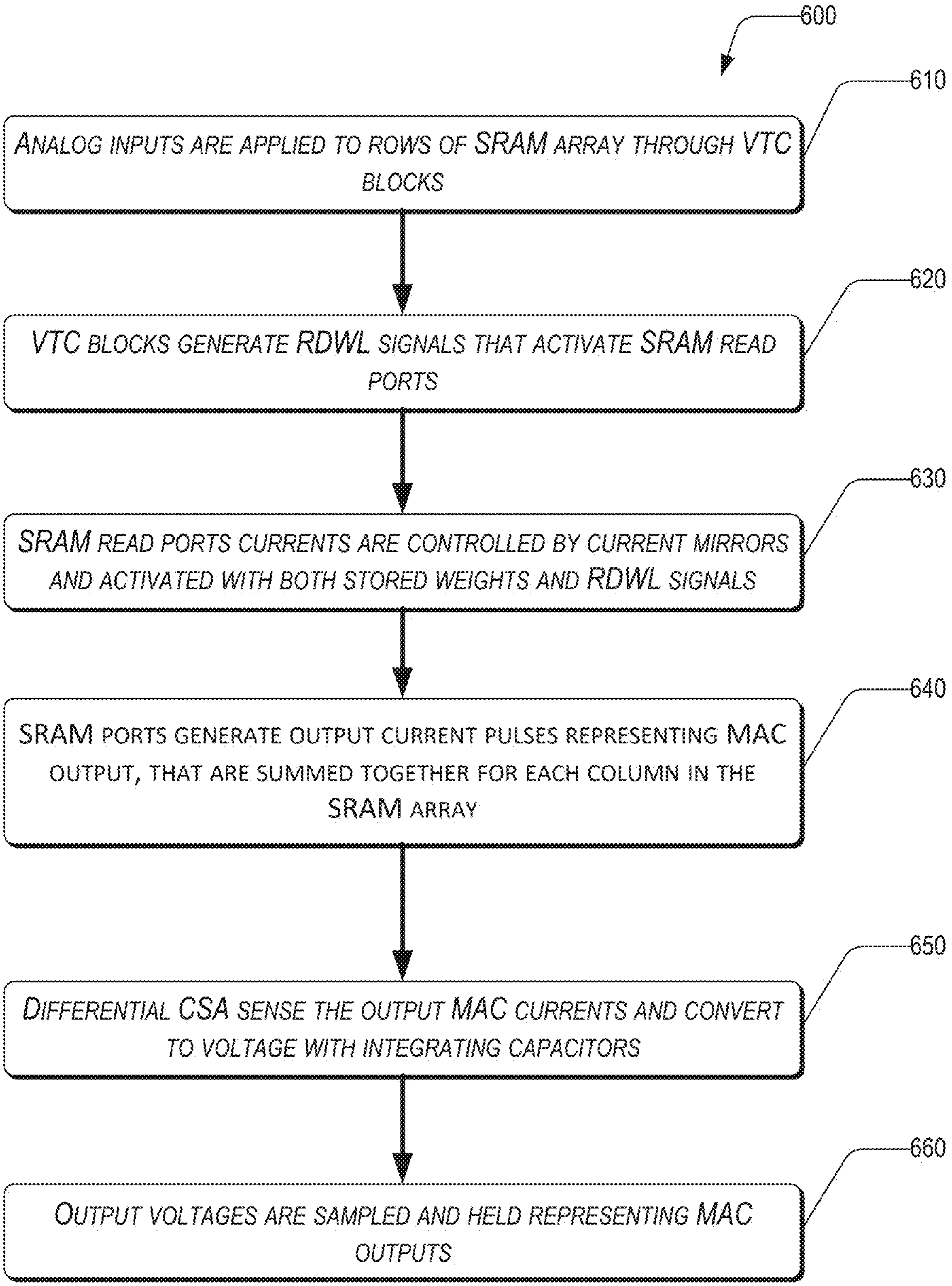
FIG. 6 is a flowchart of a method for a multiply and accumulate operation using a 12 transistor SRAM, consistent with an illustrative embodiment.

FIG. 6 shows a method 600 for a multiply and accumulate operation using a 12 transistor SRAM according to embodiments consistent with the IMC SRAM architecture described above. At block 610, analog inputs are applied to rows of SRAM array through VTC blocks. At block 620, the VTC blocks generate RDWL signals that activate SRAM read ports. At block 630, SRAM read ports' currents may be controlled by current mirrors (which control the current source transistor 280) and activated with stored weights and RDWL signals. At block 640, the SRAM read ports generate output current pulses representing MAC output, that are summed together for each column in the SRAM array. At block 650, a differential CSA senses the output MAC currents and converts the output MAC currents to voltage with current mirrors and integrating capacitors. At block 660, output voltages are sampled and held representing MAC outputs.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

Aspects of the present disclosure are described herein with reference to call flow illustrations and/or block diagrams of a method, apparatus (systems), and computer program products according to embodiments of the present disclosure. It will be understood that each step of the flowchart illustrations and/or block diagrams, and combinations of blocks in the call flow illustrations and/or block diagrams, can be implemented by computer readable program instructions.

These computer readable program instructions may be provided to a processor of a computer, special purpose computer, or other programmable data processing apparatus to produce a machine, such that the instructions, which execute via the processor of the computer or other programmable data processing apparatus, create means for implementing the functions/acts specified in the call flow process and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the call flow and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the call flow process and/or block diagram block or blocks.

The flowchart and block diagrams in the Figures illustrate the architecture, functionality, and operation of possible implementations of systems, methods, and computer program products according to various embodiments of the present disclosure. In this regard, each block in the call flow process or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or call flow illustration, and combinations of blocks in the block diagrams and/or call flow illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A static random-access memory (SRAM) device, comprising:

a voltage-to-time (VTC) conversion block;

an SRAM cell, including;

a read-port coupled to the VTC block, wherein the read-port comprises:

a first transistor coupled to a pair of cross-coupled inverters;

a pass gate transistor coupled to the first transistor; and a current-source transistor coupled to the pass gate transistor, wherein the VTC block is configured to generate a read wordline signal in response to receiving a voltage vector, the read wordline signal being applied to a row of the SRAM device and multiplied by one or more SRAM stored weights to generate analog outputs for a multiply and compute operation (MAC); and a current sense amplifier coupled to a read bit line on an output of the read-port, wherein the current sense amplifier is configured to provide a negative feedback to the read-port and adjust a voltage on the read bit line.

2. The SRAM device of claim 1, further comprising a current control circuit coupled to the current-source transistor.

3. The SRAM device of claim 1, further comprising:

a current control circuit coupled to the current-source transistor; and a current sense amplifier coupled to the read bit line, wherein:

the current control circuit is configured to limit an output current coming out of the current-source transistor and onto the read bit line, and the current sense amplifier is configured to sense the output current on the read bit line, provide a negative feedback to the read-port, and adjust a voltage on the read bit line.

4. The SRAM device of claim 1, wherein the VTC is embedded with a rectified linear unit activation function.

5. The SRAM device of claim 1, wherein the read-port is configured to activate for a certain time linearly proportional to an input voltage (Vin) based on the generated read wordline signal.

6. The SRAM device of claim 1, wherein the current-source transistor is biased in a subthreshold saturation region.

7. The SRAM device of claim 1, further comprising a read-port replica and a current mirror coupled to the read-port, configured to control a read current on the read bit line.

8. The SRAM device of claim 1, further comprising a VTC comparator block implemented with a pair of cascaded current-starved inverters.

9. The SRAM device of claim 1, wherein the SRAM cell includes a twelve transistor (12T) configuration.

10. A static random-access memory (SRAM) cell, comprising:

a read-port coupled to a VTC block of an SRAM device, including:

a first transistor coupled to a pair of cross-coupled inverters;

a pass gate transistor coupled to the first transistor;

a current-source transistor coupled to the pass gate transistor, wherein the VTC block is configured to generate a read wordline signal in response to receiving a voltage vector, the read wordline signal being applied to the SRAM cell and multiplied by one or more SRAM stored weights to generate analog outputs for a multiply and compute operation (MAC);

a read bit line coupled to the read-port; and a current sense amplifier coupled to the read bit line, wherein the current sense amplifier is configured to provide negative feedback to the read-port and to adjust a voltage on the read bit line.

11. The SRAM cell of claim 10, wherein the read-port is configured to activate for a certain time linearly proportional to an input voltage (Vin) based on the generated read wordline signal.

12. The SRAM cell of claim 10, wherein the current-source transistor is biased in a subthreshold saturation region.

13. The SRAM cell of claim 10, further comprising a read-port replica and a current mirror coupled to the read-port, configured to control a read current on a read bit line.

14. The SRAM cell of claim 10, further comprising a VTC comparator block implemented with a pair of cascaded current-starved inverters.

15. The SRAM cell of claim 10, wherein the read-port includes a twelve transistor (12T) configuration.

16. An in-memory compute (IMC) static random-access memory (SRAM) architecture, comprising:

a plurality of voltage-to-time (VTC) conversion blocks; and an SRAM array, including:

a plurality of rows coupled to the plurality of VTC blocks, each row including a plurality of SRAM cells, each SRAM cell comprising:

a read-port including:

a first transistor coupled to a pair of cross-coupled inverters;

a pass gate transistor coupled to the first transistor; and a current-source transistor coupled to the pass gate transistor, wherein each of the plurality of VTC blocks is configured to generate a read wordline signal in response to receiving a voltage vector, the read wordline signal being applied to a corresponding row of the SRAM array and multiplied by one or more SRAM stored weights to generate analog outputs for a multiply and compute operation (MAC);

a plurality of read bit lines coupled to the plurality of rows; and a current sense amplifier coupled to at least one of the plurality of read bit lines, wherein the current sense amplifier is configured to provide negative feedback to the read-port and to adjust a voltage on the at least one of the plurality of read bit lines.

17. The architecture of claim 16, wherein the SRAM array includes a plurality of columns of columns storing ternary weight values.

18. The architecture of claim 17, further comprising:

a plurality of read bitlines in the SRAM array;

a differential output current sense amplifier connected to the plurality of read bitlines; and an integrating capacitor coupled to the differential output current sense amplifier, and configured to generate an analog MAC output.

19. The architecture of claim 18, further comprising a current control circuit coupled to the current-source transistor of each of the plurality of rows in the SRAM array, wherein the current control circuit is configured to limit an output current coming out of the current-source transistor.

20. The architecture of claim 19, further comprising a read-port replica and a current mirror in the current control circuit, coupled to the read-port of each of the plurality of rows in the SRAM array.

21. The architecture of claim 16, wherein the read-port includes a twelve transistor (12T) configuration.

* * * * *